United States Patent [19]

Dufilie et al.

[11] Patent Number: 5,307,035
[45] Date of Patent: Apr. 26, 1994

[54] LOW LOSS SURFACE WAVE FILTER

[75] Inventors: Pierre Dufilie, Vernon, Conn.; Jean-Michel Hode, Valbonne, France

[73] Assignee: Thomson-CSF, Puteaux, France

[21] Appl. No.: 927,267

[22] PCT Filed: Apr. 12, 1991

[86] PCT No.: PCT/FR91/00308
§ 371 Date: Sep. 23, 1992
§ 102(e) Date: Sep. 23, 1992

[87] PCT Pub. No.: WO91/16763
PCT Pub. Date: Oct. 31, 1991

[30] Foreign Application Priority Data

Apr. 24, 1990 [FR] France ............................. 90 05189

[51] Int. Cl.5 ............................................. H03H 9/00
[52] U.S. Cl. ..................... 333/193; 333/196; 310/313 R
[58] Field of Search ............... 333/193, 194, 195, 196; 310/313 R, 313 B, 313 C, 313 D

[56] References Cited

FOREIGN PATENT DOCUMENTS 0158402 10/1985 European Pat. Off. .

OTHER PUBLICATIONS

IEEE Ultrasonics Symposium, vol. 1 2–5 Oct. 1988, (Chicago, Ill., US), P. Dufilie et al.: "A low loss high performance filter structure", pp. 127–130.

1982 Ultrasonics Symposium Proceedings, vol. 1, 27–29 Oct. 1982, (San Diego), C. L. West: "Saw convolver employing unidirectional transducers for improved efficiency", pp. 119–123.

*Primary Examiner*—Robert J. Pascal
*Assistant Examiner*—Darius Gambino
*Attorney, Agent, or Firm*—Oblon, Spivak, McClelland, Maier & Neustadt

[57] ABSTRACT

A low loss microwave surface acoustic wave filter, comprising input (2, 3) and output (4, 5) transducers, acoustically associated with coupling transducers (6, 7).

The relative positions of the transducers 2 to 7) and of their O reflectors are chosen, having regard to the weightings of the coupling transducers (6, 7) in order to obtain the desired transfer function for this filter.

7 Claims, 2 Drawing Sheets

LOW LOSS SURFACE WAVE FILTER

BACKGROUND OF THE INVENTION

1. Field of the Invention

The present invention relates to a low loss microwave surface acoustic wave filter.

2. Discussion of the Background

The type of high performance, low loss filter to which the invention relates is, for example, as described in the article by Messrs. DUFILIE, HODE and DESBOIS: "A low loss high performance filter structure", IEEE 1988 Ultrasonic Symposium (Chicago), pages 1 to 4. The filter described in this article comprises:

two unidirectional input transducers placed symmetrically on either side of a first bidirectional coupling transducer and acoustically connected to the latter;

a second bidirectional coupling transducer electrically connected to this first bidirectional coupling transducer;

two unidirectional output transducers, placed symmetrically on either side of this second bidirectional coupling transducer and acoustically connected to the latter; and two input and output terminals the first electrically connected to the two input transducers and the other to the two output transducers respectively.

SUMMARY OF THE INVENTION

The invention aims to improve the performance characteristic of this type of surface wave filter. To this end it relates to a surface wave filter comprising, in a very general way:

one or more input transducers, electrically connected to the input terminal of the filter, and acoustically connected to at least a first coupling transducer, whether weighted or not;

at least one second coupling transducer, weighted or not, electrically connected to this first coupling transducer; and acoustically connected to one or more output transducers, which are themselves electrically connected to the output terminal of the filter;

this filter being such that the positions of the input and/or output transducers with respect to the coupling transducers and/or with respect to the reflectors with which these various transducers may be associated, &re chosen, having regard to the weightings of the coupling transducers, in order to obtain the desired transfer function for this filter.

According to one feature in accordance with the invention, the filter involved comprises one or more unidirectional transducers with "O coupler", this filter being such that the transducer which is surrounded by this O coupler is offset with respect to the axis of this coupler, axis which is normal to the direction of propagation of the surface waves, by a distance which is equal to an eighth of the propagation wavelength of the surface waves, increased by a whole number of half-wavelengths.

According to another feature, the filter involved comprises two pairs of unidirectional transducers with O coupler, with a first pair associated with the input of the filter and a second pair associated with its output, and is characterised in that the internal diameters, taken in the direction of propagation of the surface waves, of the two O couplers of the first and/or of the second of these transducer couplers differ for the two O couplers of the same pair by a propagation half-wavelength of the surface waves, to within a whole number M of wavelengths, this number M possibly being different for the first and the second pair.

According to another feature, the filter involved comprises, on the input side, either two lateral input transducers acoustically connected to a central coupling transducer, or a central input transducer acoustically connected to two lateral coupling transducers, and comprises, on the output side, a configuration of transducers similar to that of the input side, and is characterised in that, on the input side and/or on the output side of the filter, the respective distances between the axis of each input, or output, transducer, and that of the coupling transducer which is associated with it differ, for the same pair of distances relative to the input or to the output of the filter, by a whole number of wavelengths, this whole number possibly being different between the input side and the output side.

According to yet another feature, the filter involved comprises, on the input side, either two lateral input transducers acoustically connected to a central coupling transducer, or a central input transducer acoustically connected to two lateral coupling transducers, and comprises, on the output side, a configuration of transducers similar to that of the input side, and is characterised in that the respective distances between the axis of an input or output transducer and that of the coupling transducer which is associated with it differ, from an input transducer to an output transducer, by a quarter wavelength, to within a whole number of half-wavelengths, and to within the phase differences of the reflection coefficients on the coupling transducers.

Finally, according to a last feature, the filter involved uses weighted coupling transducers, and is characterised in that the weightings of these coupling transducers are different and are chosen in order to obtain, in the passband of the filter, a response which is substantially identical for these coupling transducers, and in contrast a different response outside of the passband of this filter.

BRIEF DESCRIPTION OF THE DRAWINGS

In any event, the invention will be well understood and its advantages and other characteristics will emerge, during the following description of a nonlimiting exemplary embodiment, by reference to the diagrammatic drawing attached in which.

DESCRIPTION OF THE PREFERRED EMBODIMENTS

Figure 1:
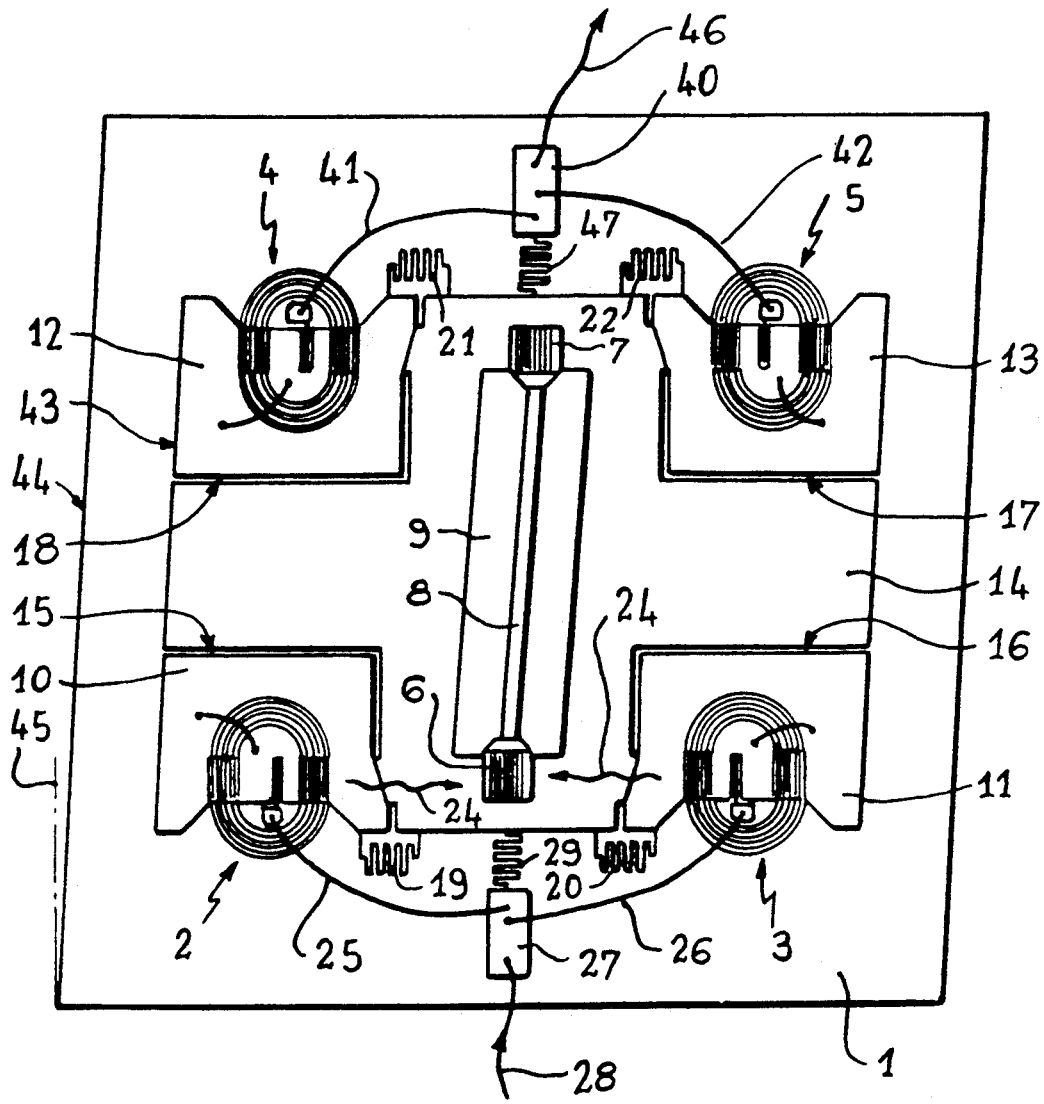
FIG. 1 is an overall view of this surface acoustic wave filter.
Figure 2:
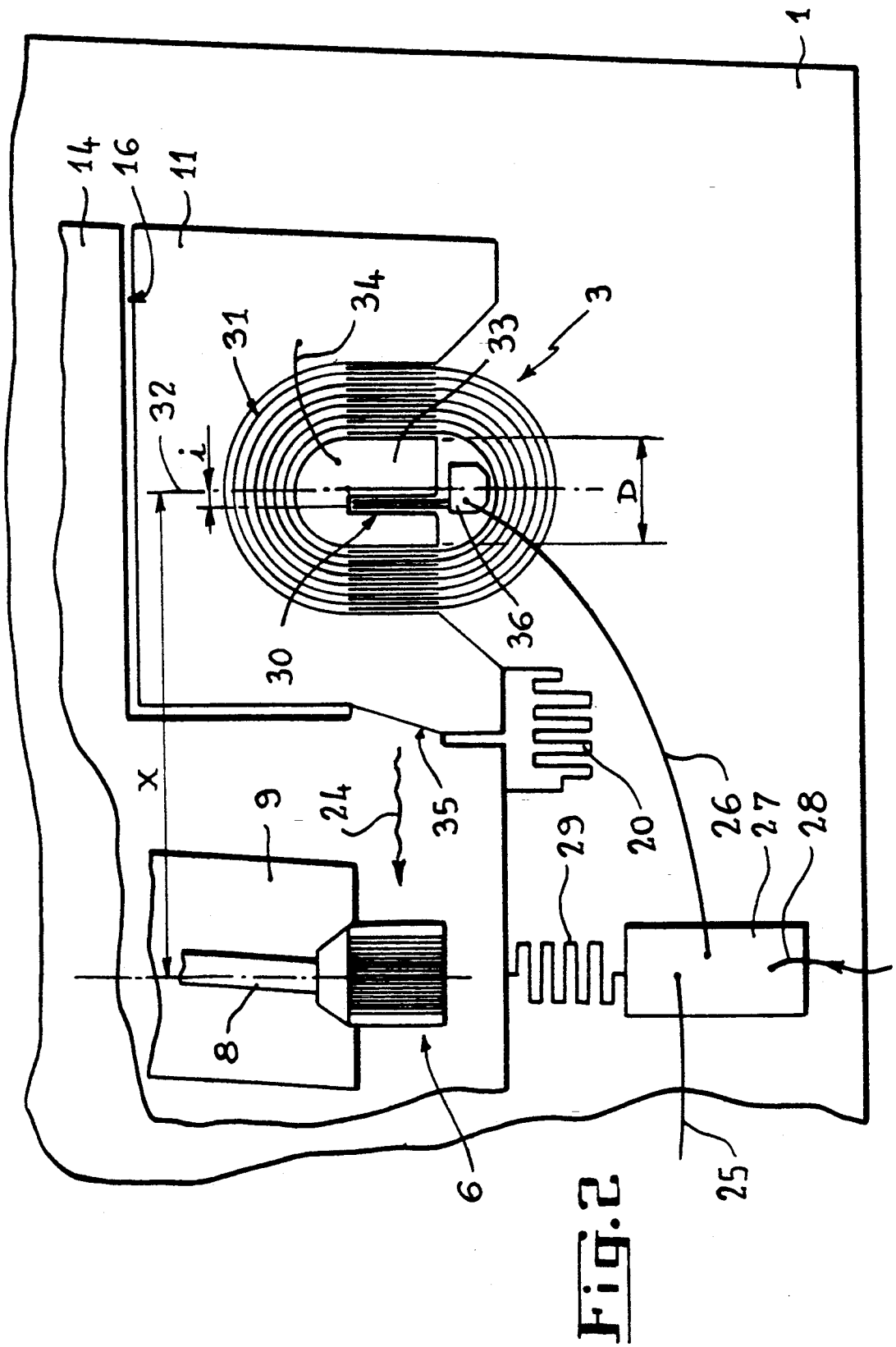
FIG. 2 is an enlarged view of a portion (right lower quarter) of this same filter.

Referring first to both FIGS. 1 and 2, a low loss microwave surface acoustic wave filter structure is involved. This filter comprises, conventionally, on an insulating substrate 1, a pair of unidirectional input transducers 2, 3 and another pair of unidirectional output transducers 4, 5, acoustically coupled by means of a bidirectional input coupling transducer 6 and of a bidirectional output coupling transducer 7.

The two coupling transducers 6, 7, which here are weighted transducers with a large number of fingers, are electrically connected to each other by a metal strip 8 deposited on another, wider insulating strip 9. Needless to say, the metal strip 8 may be replaced by a soldered wire.

The four unidirectional input/output transducers 2 to 5 have respective grounds 10 to 13 which are separated from the ground 14 of the coupling transducers 6, 7 by intervals, respectively 15 to 18. These grounds are advantageously connected together by electrical resistors 19 to 22, so as to suppress harmful pyroelectric effects.

It should be noted that the edges 43, 44 of the ground planes and of the substrate 1 are conventionally inclined with respect to the normal 45 to the direction 24 of propagation of the surface acoustic waves, which avoids disturbance caused by reflections without the use of an acoustic absorber being required.

The input transducers 2, 3 are electrically connected, by respective wires 25 and 26, to a metallised input pad 27 which receives the input wire 28 of the filter and which is protected against electrostatic discharges by a resistor 29. The same is true symmetrically for the output transducers 4, 5 (see the pad 40, the connection wires 41, 42, the output wire 46, and the resistor 47).

Each of the unidirectional transducers 2 to 5 is (see in particular the transducer 3 in enlarged view in FIG. 2), in a conventional way, a unidirectional transducer called "O coupler". It is therefore composed of a "central" transducer 30, which is, in this example, a wideband transducer called "short", that is to say having a very small number of active fingers, this central transducer being surrounded by an O-shaped "multistrip" coupler 31 and being offset with respect to the axis 32 Of this coupler 31 which is normal to the direction 24 mentioned above by a distance i which, in the conventional unidirectional transducers of this type, is equal to an eighth of the propagation wavelength $\lambda$ of the surface acoustic waves: it will be seen below that, according to one of the characteristics of the present invention, this offset i is different here from the value $\lambda/8$.

The ground connection of the neutral point 33 of the transducer 30 is produced by the bridge link 34 which links this neutral point 33 to the ground plate 11.

The ground plane 14 relative to the coupling transducers 6 and 7 acts as a screening between the input 2, 3 and output 4, 5 transducers, The separations 15 to 18 mentioned above comprise, over all of the acoustic apertures of the two acoustically-associated transducers , such as 6 and 3 f or example (see FIG. 2), a narrow interval 35 which is inclined with respect to the direction 24 of propagation of the surface acoustic waves.

The metallisations 36 and 33 correspond respectively to the "signal" terminal (live point) and ground terminal (neutral point) of the transducer 30.

According to a first characteristic, which is a feature and is in accordance with the invention, of this filter, the offset i mentioned above is near equal to an eighth of the propagation wavelength $\lambda$ of the surface acoustic waves, increased by a whole number N of half-wavelengths, i.e.:

$i = \lambda/8 + N \lambda/2$ which has the effect of obtaining, out of band, zeros in the transfer function of the coupler 31, and consequently improving the distant rejection (or out-of-band rejection) Of the filter.

These offsets i may be different according to whether unidirectional input, 2, 3, transducers or unidirectional output 4, 5 transducers are involved.

According to a second feature of this filter, the internal "diameters" D, taken in the direction 24 of propagation of the surface waves, relative to the two O couplers associated with the two input 2 and 3 transducers (see the coupler 31 in FIG. 2) and/or those relating to the two O couplers associated with the two output transducers 4, 5, differ for the same pair (2, 3 or 4, 5) by a half-wavelength $\lambda$, to within a whole number M of wavelengths, with respect to one another, this number M possibly being different for the two input transducers and f or the two output transducers. For example, these two diameters D differ by $M1\lambda + \lambda/2$ for the two input transducers 2, 3 while they differ by $M2\lambda + \lambda/2$ for the two output transducers 4, 5, M1 and M2 possibly being different integers (0, 1, 2, etc).

This offset has the effect of putting the waves reflected to right and to left of the O coupler in phase opposition, and thus of suppressing them. The reflections are of an essentially mechanical origin and are due to the fact that the surface of the piezoelectric substrate 1 is charged by metallisations.

According to a third feature, here again relating to the pair of input transducers 2, 3 and/or to the pair of output transducers 4, 5, the distances X (see FIG. 2) between the respective axes of each transducer (3 for example) and that of the coupling transducer (6 in this example) which is associated with it, differ, for thus a pair of transducers (input and/or output), by a whole number K of wavelengths, this whole number K possibly being different for the pair of input transducers (2, 3) and for the pair of output transducers (4, 5). This feature, by creating out-of-band rejection hollows in the transfer function of the filter, permits its distant out-of-band rejection to be improved.

According to a fourth feature, the aim of which is to remedy the disturbances due to double-transit reflections, the distances X quoted above differs from an input transducer 2 or 3 to an output transducer 4 or 5 by a quarter wavelength $\lambda$, to within a whole number P of half-wavelengths and to within the phase differences of the reflection coefficients in symmetric driving Rc1, Rc2 on the two coupling transducers 6, 7. For example, the distance X2 relating to the output transducer 4 is linked to that X1 relating to the input transducer 2 by the following relation:

$$X2 - X1 = \lambda/4 + \frac{\phi}{4\pi} \lambda + P \lambda/2$$

where $\phi$ is defined by $$Rc2/Rc1 = \left| \frac{Rc2}{Rc1} \right| e^{-j\phi}$$

A fifth characteristic relates to the weightings of the coupling transducers 6, 7. It is known, in this type of filter, that the coupling transducers have to have practically identical admittances in the passband of the filter and that it is necessary to weight these transducers in order to lower the secondary lobes.

According to this fifth characteristic, the weightings of the coupling transducers 6, 7 are different, and they are chosen in order to obtain a substantially identical response for these coupling transducers 6, 7 in the passband of the filter, and, in contrast, a different response outside the passband of the filter. This feature gives rise to a reduction in the amplitude of the secondary lobes, and thus improves the out-of-band rejection of the filter.

The electrical tuning of the coupling transducers 6, 7 may be either of "parallel" or "series" tuning, well-known in the technology, or even tuning by "matched impedance" such as that described in the French Patent Application by the applicant No. 8813536, filed on the 14th October 1988.

The input-output transducers proper (such as the transducer 30, FIG. 2), are, in this example, transducers known as "short", having between 3 and 8 active fingers for example. They could just as well be transducers weighted in the same way as the coupling transducers 6, 7 in order to have a low capacitive reactance at the central frequency. In this latter case, the filter does not need an electrical tuning circuit when the reduced impedance of the two input or output transducers is close to the impedance of the source of the load.

It goes without saying that the invention is not limited to the exemplary embodiment which has just been described. It applies, for example, also where characteristics are concerned which do not bring the O couplers into play, to filters of similar structure but which use unidirectional transducers other than transducers with an O coupler. It applies equally to all imaginable outputs of variants of this filter structure. Such a variant could consist, by way of a strictly non-limiting example, of a filter of the same species as that of FIG. 1, but comprising a single axial and bidirectional input transducer reemitting on either side towards two unidirectional input coupling transistors, which are themselves electrically connected to two output coupling transistors, themselves also unidirectional, and reemitting towards a single output transducer, itself also axial and bidirectional: in such a configuration, which is the inverse of that of FIG. 1 while carrying out the same function, there are four coupling transducers in total and only two input/output transducers.

We claim:

1. A surface wave filter comprising:
   at least one input transducer;
   at least one first coupling transducer acoustically connected to the at least one input transducer;
   at least one second coupling transducer electrically connected to the at least one first coupling transducer;
   at least one output transducer acoustically connected to the at least one second coupling transducer;
   wherein at least one of the at least one input transducer or the at least one output transducer comprises a central transducer element and a coupler surrounding the central transducer element, wherein the central transducer element is offset with respect to an axis of the coupler normal to a direction of propagation of a surface wave by a distance i, where $i = \lambda/8 + N\lambda/2$ where
   $\lambda$ is a propagation wavelength of the surface wave, and
   N is a non-zero integer.

2. The surface wave filter according to claim 1, wherein the at least one input transducer comprises two input transducers and wherein the at least one output transducer comprises two output transducers.

3. A surface wave filter comprising:
   two input transducers;
   at least one first coupling transducer acoustically connected to the two input transducers;
   at least one second coupling transducer electrically connected by a metal strip to the at least one first coupling transducer;
   two output transducers acoustically connected to the at least one second coupling transducer;
   wherein the two input transducers and the two output transducers each comprise a central transducer element and a coupler surrounding the central transducer element;
   wherein for at least one of the two input or two output transducers the central transducer element is offset with respect to a central axis of the coupler normal to a direction of propagation of a surface wave by a distance i, where $i = \lambda/8 + N/\lambda 2$ where
   $\lambda$ is a propagation wavelength of the surface wave, and
   N is a non-zero integer.

4. The surface wave filter according to claim 3, wherein internal diameter of the couplers of the two input transducers taken in the direction of propagation of the surface wave differ by $A\lambda + \lambda/2$ where A is an integer,
   and wherein the internal diameters of the couplers of the two output transducers taken in the direction of propagation of the surface wave differ by $B\lambda + \lambda/2$ where B is an integer.

5. The surface wave filter according to claim 3, where for at least one of the two input or two output transducers a distance from the central axis of the central transducer elements to the metal strip differ by $K\lambda$, where K is an integer.

6. The surface wave filter according to claim 3, wherein a distance X2 separates one of the two output transducers from the metal strip and a distance X1 separates one of the two input transducers from the metal strip, and where $$X2 - X1 = \lambda/4 + \frac{\phi}{4\pi}\lambda + P\lambda/2$$

where
   P is an integer;
   $\phi$ is defined by $$Rc2/Rc1 = \left|\frac{Rc2}{Rc1}\right| e^{-j\phi},$$

where
   Rc1 is a reflection coefficient in symmetric driving of the at least one first coupling transducer and
   Rc2 is a reflection coefficient in symmetric driving of the at least one second coupling transducer.

7. The surface wave filter according to claim 3, wherein the first and second coupling transducers are weighted coupling transducers with different weightings so that in a passband of the surface wave filter a response of the first and second coupling transducers is the same and outside a passband of the surface wave filter a response of the first and second coupling transducers is different.

* * * * *